United States Patent
Wang

(10) Patent No.: US 11,715,627 B2
(45) Date of Patent: Aug. 1, 2023

(54) REACTION CHAMBER AND PLASMA APPARATUS

(71) Applicant: BEIJING NAURA MICROELECTRONICS EQUIPMENT CO., LTD., Beijing (CN)

(72) Inventor: Wei Wang, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 180 days.

(21) Appl. No.: 17/258,706

(22) PCT Filed: Jul. 24, 2019

(86) PCT No.: PCT/CN2019/097547
§ 371 (c)(1),
(2) Date: Jan. 7, 2021

(87) PCT Pub. No.: WO2020/024859
PCT Pub. Date: Feb. 6, 2020

(65) Prior Publication Data
US 2021/0272778 A1  Sep. 2, 2021

(30) Foreign Application Priority Data

Aug. 1, 2018 (CN) .......................... 201810864893.2
Aug. 1, 2018 (CN) .......................... 201821231497.8

(51) Int. Cl.
*H01J 37/32* (2006.01)
*H01L 21/67* (2006.01)
*H01L 21/687* (2006.01)

(52) U.S. Cl.
CPC .. *H01J 37/32458* (2013.01); *H01L 21/67069* (2013.01); *H01L 21/68742* (2013.01); *H01J 37/32082* (2013.01); *H01J 2237/3343* (2013.01)

(58) Field of Classification Search
CPC ................ H01J 37/32458; H01J 37/32; H01J 37/32082; H01J 2237/3343; H01L 21/67069; H01L 21/68742; H01L 21/6719
See application file for complete search history.

(56) References Cited

U.S. PATENT DOCUMENTS 5,685,914 A * 11/1997 Hills ................ H01J 37/32449
156/915
2005/0224180 A1* 10/2005 Bera ................... H01J 37/3244
156/345.33

(Continued)

FOREIGN PATENT DOCUMENTS

CN 106298417 A 1/2017
CN 106971932 A 7/2017

(Continued)

OTHER PUBLICATIONS

World Intellectual Property Organization (WIPO) International Search Report for PCT/CN2019/097547 dated Oct. 28, 2019 5 Pages (including translation).

(Continued)

*Primary Examiner* — Yuechuan Yu
(74) *Attorney, Agent, or Firm* — Anova Law Group, PLLC

(57) ABSTRACT

A reaction chamber includes a chamber body, an inner lining, and a lifting drive device. The inner lining is arranged in the chamber body. A wafer transfer opening is arranged at a sidewall of the chamber body. The inner lining includes a first inner lining and a second inner lining. The first inner lining is fixedly connected to the chamber body. The second (Continued)

inner lining is coaxially sleeved outside or inner sleeved at the first inner lining. The first inner lining and the second inner lining include a gap in a horizontal direction. The lifting drive device is configured to be connected to the second inner lining, when performing process processing on a wafer, drive the second inner lining to a predetermined first position to cause the second inner lining to cover the wafer transfer opening and the first inner lining and the second inner lining to partially overlap.

16 Claims, 4 Drawing Sheets

(56) References Cited

U.S. PATENT DOCUMENTS

2013/0334199 A1* 12/2013 Yousif .................. H01L 21/324
438/795
2013/0337655 A1* 12/2013 Lee .................. H01L 21/67742
438/715

FOREIGN PATENT DOCUMENTS

| CN | 107578977 A | 1/2018 |
| CN | 207320060 U | 5/2018 |
| CN | 108987237 A | 12/2018 |
| CN | 208478281 U | 2/2019 |
| CN | 106971932 B | 4/2019 |
| JP | 2014072366 A | 4/2014 |
| JP | 2016136636 A | 7/2016 |
| KR | 20000073431 A | 12/2000 |
| KR | 20180047236 A | 5/2018 |

OTHER PUBLICATIONS

Taiwan Intellectual Property Office Notice of Review Opinion for Application No. 107146146 Aug. 19, 2019 7 pages (with translation).

Taiwan Intellectual Property Office Certificate of Patent Approval for Application No. 107146146 Mar. 27, 2020 5 pages (with translation).

* cited by examiner

REACTION CHAMBER AND PLASMA APPARATUS

CROSS-REFERENCES TO RELATED APPLICATIONS

This application is a national phase entry under 35 U.S.C. § 371 of International Application No. PCT/CN2019/097547, filed on Jul. 24, 2019, which claims priority to Chinese Application No. 201810864893.2 filed on Aug. 1, 2018, and Chinese Application No. 201821231497.8 filed on Aug. 1, 2018, the entire content of all of which are incorporated herein by their references.

TECHNICAL FIELD

The present disclosure generally relates to the semiconductor manufacturing technology field and, more particularly, to a reaction chamber and plasma apparatus.

BACKGROUND

Plasma apparatus is widely used in manufacturing processes of semiconductor, solar cell, flat panel display, etc. In the current manufacturing process, various types of plasma apparatus have been used, including capacitively coupled plasma, inductively coupled plasma, and electron cyclotron resonance plasma. Currently, these types of discharges are widely used in physical vapor deposition (PVD), plasma etching, and plasma chemical vapor deposition (CVD), etc.

FIG. 1 is a reaction chamber structure commonly used in a semiconductor dry etching apparatus. The process gas flows into a reaction chamber 09 through a gas inlet channel 02. High-frequency energy generated by an upper electrode radio frequency antenna 01 passes through a dielectric window 03 to ionize the process gas under the dielectric window 03 into plasma 04. The plasma 04 performs etching on a target area of a wafer 06 through a physical bombardment or a chemical reaction. The inner lining 05 of the reaction chamber 09 limits the plasma 04 to a certain area, which may protect the inner wall of the reaction chamber 09 from being etched simultaneously. An etching by-product generated during the process is discharged to a pressure controller 010 through an exhaust channel 08 at the bottom of the inner lining 05. Finally, an air pump 011 pumps the by-product away. A wafer transfer opening 015 at a side surface of the inner lining 05 is configured to transfer the wafer 06 in before the etching process starts and transfer the wafer 06 out after the etching process ends.

Before the etching process starts, an inner door 013 descends under the action of an inner door driver 012. Then, a gate valve 014 is opened, and the wafer 06 is transferred into the reaction chamber. Then, the gate valve 014 is closed, and the inner door 013 rises under the action of the inner door driver 012. Then, the etching process starts.

However, when the etching process is performed in this reaction chamber, the etching uniformity is undesirable.

SUMMARY

Embodiments of the present disclosure provide a reaction chamber and plasma apparatus, which may at least partially solve the technical problems in the existing technology.

According to an aspect of embodiments of the present disclosure, the present disclosure provides a reaction chamber, including a chamber body, an inner lining, and a lifting drive device.

The inner lining is arranged in the chamber body. A wafer transfer opening is formed at a sidewall of the chamber body.

The inner lining includes a first inner lining and a second inner lining. The first inner lining is connected to the chamber body. The second inner lining is coaxially sleeved outside or inside the first inner lining. A gap is formed between the first inner lining and the second inner lining in a horizontal direction.

The lifting drive device is connected to the second inner lining and configured to, when performing a process processing on a wafer, to drive the second inner lining to move to a predetermined first position to cause the second inner lining to block the wafer transfer opening, and to cause the first inner lining and the second inner lining to partially overlap. The first inner lining and the second inner lining have an overlapped part. The overlapped part has a predetermined length. The first inner lining and the second inner lining enclose a process area configured to perform the process processing on the wafer.

Optionally, the lifting drive device includes a lifting bellows, which is retractable.

The lifting bellows is connected to the second inner lining. The lifting drive device drives the lifting bellows to extend and retract to drive the second inner lining to rise and descend.

Optionally, the lifting drive device further includes a cylinder assembly.

The cylinder assembly is configured to drive the lifting bellows to extend and retract.

Optionally, the cylinder assembly includes a cylinder and a connector. The lifting bellows includes a movable shaft arranged in the lifting bellows.

A cylinder body of the cylinder is affixed at the chamber body. A cylinder shaft of the cylinder is connected to an upper end of the movable shaft by the connector. An upper end of the lifting bellows is connected to the chamber body. A lower end of the lifting bellows is connected to a lower end of the movable shaft.

The second inner lining is connected to the lifting bellows and the movable shaft.

Optionally, the reaction chamber further includes an inner lining mounting member. The second inner lining is connected to the lower ends of the lifting bellows and the movable shaft by the inner lining mounting member.

Optionally, the second inner lining includes a bottom lining and a vertical lining. The vertical lining is arranged oppositely to an inner wall of the chamber body. The bottom lining is arranged at a bottom of the vertical lining and extends toward a middle of the chamber body. A plurality of ventholes penetrate the bottom lining in a thickness direction and are arranged at the bottom lining to vent byproduct generated in the process area through the ventholes.

Optionally, a width of the gap ranges from 1 mm to 2 mm. A ratio of the predetermined length and the width of the gap is greater than 7:1.

Optionally, the reaction chamber further includes a support assembly. The support assembly is configured to support the wafer and arranged in the chamber body.

Optionally, when feeding or reclaiming, the lifting drive device drives the second inner lining to a predetermined second position to move the second inner lining above the wafer transfer opening.

As a second aspect of the present disclosure, embodiments of the present disclosure provide a plasma apparatus including a reaction chamber. The reaction chamber includes the reaction chamber provided by the present disclosure.

The reaction chamber and plasma apparatus may limit the plasma in a certain process area during the process and at the same time, protect the inner wall of the chamber body from being etched, and improve the airflow uniformity during the process. As such, a long-term stability of the process is ensured to ensure a better consistency of the etching result from the center to the edge of the wafer. Thus, the yield of the products is increased.

The additional aspects and advantages of embodiments of the present disclosure are partially given in the following description. The additional aspects and advantages become obvious from the following description, or are understood through the practice of the present disclosure.

BRIEF DESCRIPTION OF THE DRAWINGS

To describe the present disclosure or the technical solution of the existing technology clearer, the accompanying drawings that are needed for the description of embodiments or the existing technology are described. Apparently, the accompanying drawings described below show merely some embodiments of the present disclosure. For those of ordinary skill in the art, other drawings may be obtained from these drawings without creative efforts.

DETAILED DESCRIPTION OF THE EMBODIMENTS

Figure 1:
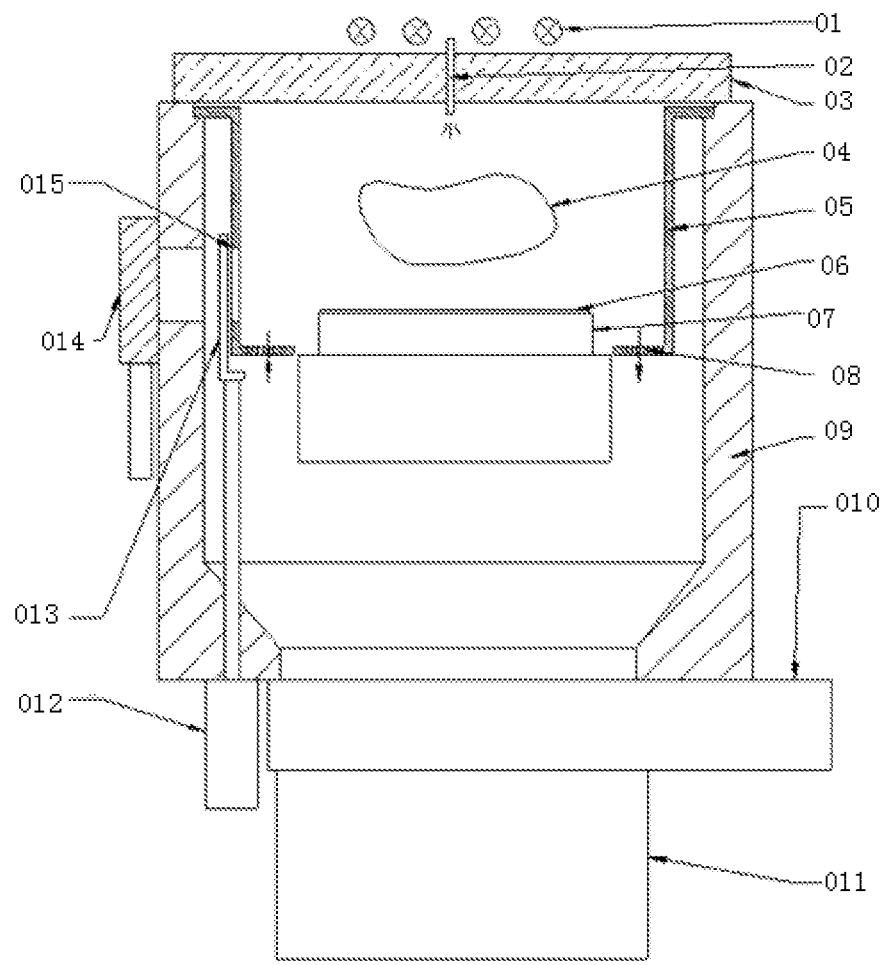
FIG. 1 is a schematic structural diagram of a reaction chamber of the existing technology.

The present disclosure is described more thoroughly below with reference to the accompanying drawings, in which exemplary embodiments of the present disclosure are described. The technical solutions of the present disclosure are described clearly and entirely in connection with the accompanying drawings of embodiments of the present disclosure. Obviously, described embodiments are only some of embodiments of the present disclosure, but not all embodiments. Based on embodiments of the present disclosure, all other embodiments obtained by those of ordinary skill in the art without any creative effort are within the scope of the present disclosure. The technical solutions of embodiments of the present disclosure are described in various aspects below in connection with accompanying drawings.

To facilitate the description, directions of "left," "right," "up," and "down" described in the specification are consistent with directions of left, right, up, and down in the drawings.

The terms "first" and "second" in the specification are only used to describe the difference, and do not have other special meanings.

The inventor of the present disclosure has found through repeated research that when the reaction chamber of the related technology performs an etching process, reasons for a low etching uniformity are as follows.

First, in the current design, no friction is required between relatively moving parts. Second, the inner lining 05 and the inner door 013 both include manufacturing and installation errors, which inevitably causes a gap of approximately 1 mm to 2 mm between the inner door 013 and the inner lining 05.

The above two reasons may cause the plasma distribution inside the reaction chamber 09 to have a sudden change at the inner door 013, so as to affect the uniformity of the etching result.

Figure 2:
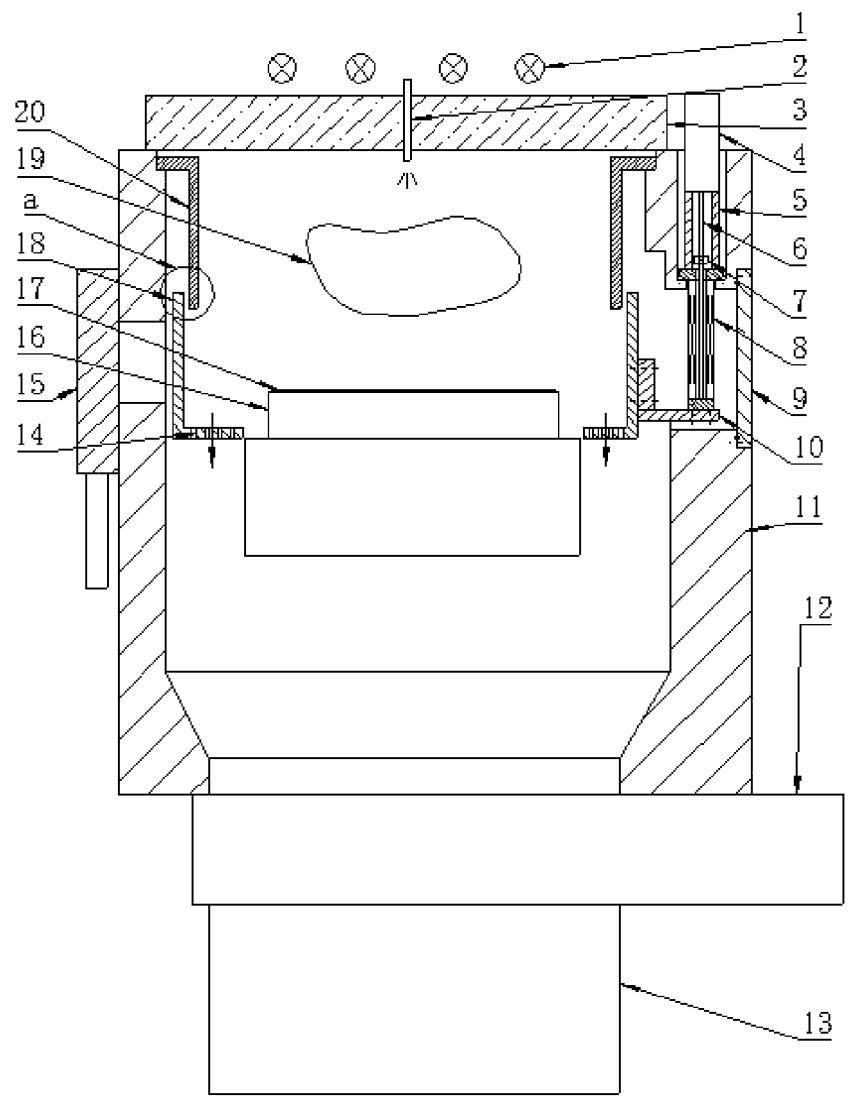
FIG. 2 is a schematic structural diagram showing a second inner lining at a low position of a reaction chamber according to some embodiments of the present disclosure.

According to the above, the present disclosure provides a reaction chamber. As shown in FIG. 2, the reaction chamber includes a chamber body 11, an inner lining, and a lifting drive device. The inner lining is arranged in the chamber body 11. A wafer transfer opening is arranged at a sidewall of the chamber body 11. The inner lining includes a first inner lining 20 and a second inner lining 18. The first inner lining 20 is connected to the chamber body 11. The second inner lining 18 is coaxially sleeved outside or sleeved inside the first inner lining 20. To ensure that the second inner lining 18 does not scratch the first inner lining 20 during movement of the second inner lining 18, a gap is included between the first inner lining 20 and the second inner lining 18 in a horizontal direction. The lifting drive device may be configured to drive the second inner lining 18 to rise or descend.

When performing process processing on a wafer 17, the lifting drive device may drive the second inner lining 18 to move to (for example, "move" may refer to "descend" here) a predetermined first position. As such, the first inner lining 20 and the second inner lining 18 partially collide, and a length of an overlapping part may be a predetermined length. Meanwhile, the second inner lining 18 may cover the wafer transfer opening and cause the wafer 17 to be located in a process area enclosed by the first inner lining and the second inner lining. When feeding or reclaiming, the lifting drive device may also drive the second inner liner 18 to move (usually, "move" may refer to "rise") a predetermined second position to cause the second inner liner 18 to be located above the wafer transfer opening.

The first position, the second position, and the predetermined length may be determined by experiments and adjustment.

When the second inner lining is at the first position, the first inner lining 20 and the second inner lining 18 located inside of the chamber body 11 may constraint the plasma 19 in a certain process area. Meanwhile, the first inner lining and the second inner lining may protect the inner wall of the chamber body 11 from being etched.

Figure 3:
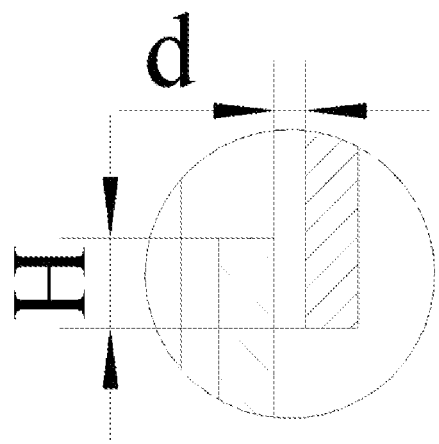
FIG. 3 is a schematic partial enlarged view of an area "a" in FIG. 2.

As shown in FIG. 3, a width d of the gap between the first inner lining 20 and the second liner lining 18 may range from 1 mm to 2 mm. To ensure that the plasma 19 may not escape to the outside of the first inner lining 20 through the gap between the first inner lining 20 and the second inner lining 18 during the process, preferably, a predetermined length H of the overlapping part of the first inner lining 20 and the second inner lining 20 satisfies H:d>7:1.

In an embodiment, the reaction chamber includes an upper electrode radiofrequency wire 1 and a dielectric window 3. The dielectric window 3 is connected to the top of the chamber body 11. The dielectric window 3 is located above the first inner lining 20 and the second inner lining 18. The upper electrode radiofrequency wire 1 is located above the dielectric window 3, and an air inlet channel 2 is arranged at the dielectric window 3. When performing the process processing on the wafer 17, the upper electrode radiofrequency wire 1 may be configured to apply radiofrequency energy to the gas in the process area. A support assembly includes a lower electrode 16. The wafer 17 is located above the lower electrode 16.

The processing gas may flow into the chamber body 11 through the air inlet channel 2. The high-frequency energy generated by the upper electrode radiofrequency wire 1 may penetrate the dielectric window 3 to ionize the process gas located in the process area below the dielectric window 3 to the plasma 19. The plasma 19 etches a target area at the wafer 17 through physical bombardment or chemical reaction.

A plurality of ventholes 14 are arranged at the bottom of the second inner lining 18. The etching byproducts generated in the process area during the process may be discharged through the ventholes 14 to a pressure controller 12. Eventually, an air pump 13 may pump the byproduct out.

In the present disclosure, how the venthole 14 is arranged is not limited. Preferably, the second inner lining 18 may include a bottom lining and a vertical lining. The vertical lining may be arranged opposite to the inner wall of the chamber body 11. The bottom lining may be arranged at the bottom of the vertical lining. The bottom lining may extend toward the middle of the chamber body 11. A plurality of ventholes 14 penetrating the bottom lining in a thickness direction may be arranged at the bottom lining.

In an embodiment, the lifting drive device may include a plurality of types. For example, the lifting drive device includes a retractable lifting bellows 8. The lifting bellows 8 is connected to the second inner lining 18. The lifting drive device may drive the lifting bellows 8 to extend and retract to drive the second inner lining 18 to rise and descend.

In the present disclosure, how to drive the lifting bellows 8 to extend and retract is not limited. Preferably, the lifting driving device may include a cylinder assembly. The lifting driving device may be configured to drive the lifting bellows 8 to extend and retract by the cylinder assembly.

The cylinder assembly includes a cylinder 4 and a connector. The lifting bellows 8 further includes a movable shaft arranged in the lifting bellows 8. The connector may have a plurality of types, such as a cylinder shaft connection nut/float joint 7, etc. The cylinder body of the cylinder 4 may be fixed at the chamber body 11. A cylinder shaft 6 of the cylinder 4 is connected to an upper end of the movable shaft by the connector. The upper end of lifting bellows 8 is connected to the chamber body 11. The lower end of the lifting bellows 8 is connected to a lower end of the movable shaft. The second inner lining 18 is connected to the lifting bellows 8 and the movable shaft.

The cylinder body of the cylinder 4 is connected to the chamber body 11 by a cylinder connector 5. The upper end of the lifting bellows 8 may be fixed at the chamber body 11 by a screw. The second inner lining 18 may be connected to the lifting bellows 8 and the movable shaft by an inner lining mounting member 10. During mounting, a rear cover 9 on the rear side of the chamber body 11 may be opened. The cylinder shaft 6 is connected to the movable shaft inside the lifting bellows 8 by the cylinder shaft connection nut/float joint 7. The movable shaft inside the lifting bellows 8 and the lower end of the lifting bellows 8 may be connected by welding or formed by integrated processing. When being driven by the cylinder 4, the movable shaft inside the lifting bellows 8 may drive the second inner liner 18 to move up and down.

Figure 4:
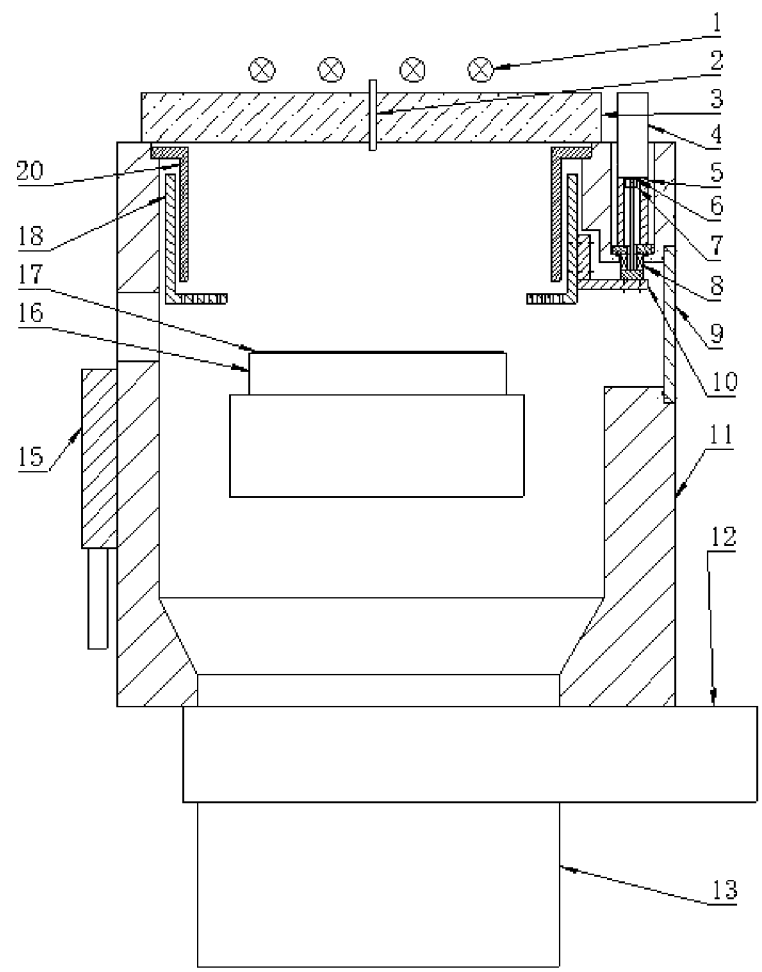
FIG. 4 is a schematic structural diagram showing a second inner lining at a high position of a reaction chamber according to some embodiments of the present disclosure.

The chamber body 11 includes a wafer transfer opening. The wafer transfer opening may be controlled to open and close by a gate valve 15. As shown in FIG. 4, when feeding or reclaiming, the lifting drive device may drive the second inner liner 18 to rise and be located at the second predetermined position. The second inner lining 18 is located above the wafer transfer opening to facilitate the removal or insertion of the wafer 17 through the wafer transfer opening. The second position may be determined through experiments and adjustment. Before the etching process starts, the second inner lining 18 rises under the action of the cylinder 4, and the gate valve 15 is opened. After the wafer 17 is transferred into the chamber body 11, the gate valve is closed, the second inner liner 18 descends under the action of the cylinder 4, and then, the etching process starts.

To arrange the wafer, the reaction chamber further includes the support assembly which is configured to support the wafer 17. The support assembly is arranged inside the chamber body 11.

In an embodiment, the present disclosure provides plasma apparatus. The plasma apparatus includes a reaction chamber. The reaction chamber may use the reaction chamber of above embodiments. The plasma apparatus may be capacitively coupled plasma apparatus or inductively coupled plasma apparatus.

The reaction chamber and plasma apparatus provided by above embodiments may limit the plasma to a certain process area during the processing, and at the same time, may protect the inner wall of the chamber body from being etched. Thereby, the gas flow uniformity may be improved in the process, and the long-term stability of the process may be ensured. As such, the etching result from the center to the edge of the wafer may have a better consistency, and the product yield may be improved.

Unless otherwise specified, if any one of the above-mentioned technical solutions disclosed in the present disclosure discloses a numerical range, then the disclosed numerical range is a preferred numerical range. Any skilled in the art of the present disclosure may understand that the preferred numerical range is only the numerical value with obvious technical effect or representative value among many feasible numerical values. Due to a large number of numerical values that cannot be exhaustively listed, the present disclosure discloses some numerical values to illustrate the technical solutions of the present disclosure. The above-listed numerical values should not limit the protection scope of the present disclosure.

Meanwhile, if the above-mentioned present disclosure discloses or involves parts or structural parts that are fixedly connected to each other, unless otherwise specified, the fixed connection may be understood as a fixed connection that can be detached (e.g., connection using bolts or screws), or a non-detachable fixed connection (e.g., a connection of riveting and welding). Of course, a mutual fixed connection may also be replaced (except obviously the integrated forming process cannot be used) by an integrated structure (e.g., manufactured integrally by a casting process).

In addition, unless otherwise specified, the terms used to represent a positional relationship or shape in any of the technical solutions disclosed in the present disclosure include a state or shape, which is like, similar, or close to the position relationship or shape. Any component provided by the present disclosure may be composed of a plurality of individual components or may be a single component manufactured by the integral forming process.

The above embodiments are only used to illustrate the technical solutions of the present disclosure and not to limit them. Although the present disclosure has been described in detail with reference to the preferred embodiments, those of ordinary skill in the art should understand that modifications may be made to specific embodiments of the present disclosure or equivalent replacement may be performed on some technical features. Without departing from the spirit of the technical solution of the present disclosure, those modifications and equivalent replacement should be within the scope of the present disclosure.

The description of the present disclosure is aimed for example and description, and is not exhaustive or limits the present disclosure to the disclosed form. Many modifications and changes are obvious to those of ordinary skill in the art. Embodiments are selected and described to better illustrate the principle and practical application of the present disclosure, and to enable those of ordinary skill in the art to understand the present disclosure to design various embodiments with various modifications suitable for specific purposes.

What is claimed is:

1. A reaction chamber comprising:
a chamber body;
an inner lining;
a support assembly configured to support a wafer; and
a lifting drive device;
wherein:
the inner lining and the support assembly are disposed inside the chamber body;
the inner lining includes a first inner lining and a second inner lining;
peripheral walls of the first inner lining and the second inner lining are both continuously enclosed surfaces;
the first inner lining is fixedly connected to the chamber body;
the second inner lining is coaxially configured inside the first inner lining and away from the chamber body;
the second inner lining is located above the support assembly;
the lifting drive device is configured to drive the second inner lining to ascend or descend inside the first inner lining;
the lifting drive device includes:
a cylinder assembly connected to the chamber body;
a retractable lifting bellows located under the cylinder assembly; and
an inner lining mounting member connected to a sidewall of the second inner lining, a top surface of the inner lining mounting member being connected to a lower end of the retractable lifting bellows; and
the cylinder assembly is configured to drive the retractable lifting bellows to extend to drive the second inner lining to descend, and to drive the retractable lifting bellows to retract to drive the second inner lining to ascend.

2. The reaction chamber of claim 1, wherein:
an accommodating space is disposed at a sidewall of the chamber body and is connected to an inner space of the chamber body;
the cylinder assembly is disposed inside the accommodating space; and
the lifting bellows is disposed inside the inner space of the chamber body.

3. The reaction chamber of claim 2, wherein:
the cylinder assembly includes:
a cylinder; a connector; and a cylinder connector;
the cylinder is fixed in the accommodating space by the cylinder connector;
a cylinder shaft of the cylinder is connected to an upper end of a movable shaft of the lifting bellows by the connector;
an upper end of the lifting bellows is connected to the chamber body; and
a lower end of the lifting bellows is connected to a lower end of the movable shaft.

4. The reaction chamber of claim 1, wherein:
the second inner lining is vertically closer to the support assembly than the first inner lining;
when the wafer is processed, the lifting drive device drives the second inner lining to descend to a predetermined first position;
the first inner lining and the second inner lining have an overlapped part of a predetermined length; and
the wafer is located inside a process area enclosed by the first inner lining and the second inner lining.

5. The reaction chamber of claim 4, wherein:
a plurality of ventholes are disposed at a bottom of the second inner lining; and
etching byproducts generated in the process area are discharged through the plurality of ventholes.

6. The reaction chamber of claim 4, wherein:
a gap is formed between the first inner lining and the second inner lining;
a width of the gap ranges from 1 mm to 2 mm; and
a ratio of the predetermined length and the width of the gap is greater than 7:1.

7. The reaction chamber of claim 2, wherein:
the lifting bellows is located outside the peripheral walls of the first inner lining and the second inner lining; and
a detachable rear cover is disposed at the sidewall of the chamber body in an area corresponding to the lifting bellows.

8. The reaction chamber of claim 1, wherein:
a wafer transfer opening is disposed at a sidewall of the chamber body;
when feeding or reclaiming, the lifting drive device drives the second inner lining to ascend to a predetermined second position to move the second inner lining above the wafer transfer opening.

9. A plasma apparatus comprising a reaction chamber, the reaction chamber including:
a chamber body;
an inner lining;
a support assembly configured to support a wafer; and
a lifting drive device;
wherein:
the inner lining and the support assembly are disposed inside the chamber body;
the inner lining includes a first inner lining and a second inner lining;
peripheral walls of the first inner lining and the second inner lining are both continuously enclosed surfaces;
the first inner lining is fixedly connected to the chamber body;
the second inner lining is coaxially configured inside the first inner lining and away from the chamber body;
the second inner lining is located above the support assembly;
the lifting drive device is configured to drive the second inner lining to ascend or descend inside the first inner lining;
the lifting drive device includes:
a cylinder assembly connected to the chamber body;
a retractable lifting bellows located under the cylinder assembly; and
an inner lining mounting member connected to a sidewall of the second inner lining, a top surface of the inner lining mounting member being connected to a lower end of the retractable lifting bellows; and the cylinder assembly is configured to drive the retractable lifting bellows to extend to drive the second inner lining to descend, and to drive the retractable lifting bellows to retract to drive the second inner lining to ascend.

10. The plasma apparatus of claim 9, wherein:
an accommodating space is disposed at a sidewall of the chamber body and is connected to an inner space of the chamber body;
the cylinder assembly is disposed inside the accommodating space; and
the lifting bellows is disposed inside the inner space of the chamber body.

11. The plasma apparatus of claim 10, wherein:
the cylinder assembly includes:
a cylinder; a connector; and a cylinder connector;
the cylinder is fixed in the accommodating space by the cylinder connector;
a cylinder shaft of the cylinder is connected to an upper end of a movable shaft of the lifting bellows by the connector;
an upper end of the lifting bellows is connected to the chamber body; and
a lower end of the lifting bellows is connected to a lower end of the movable shaft.

12. The plasma apparatus of claim 9, wherein:
the second inner lining is vertically closer to the support assembly than the first inner lining;
when the wafer is processed, the lifting drive device drives the second inner lining to descend to a predetermined first position;
the first inner lining and the second inner lining have an overlapped part of a predetermined length; and
the wafer is located inside a process area enclosed by the first inner lining and the second inner lining.

13. The plasma apparatus of claim 12, wherein:
a plurality of ventholes are disposed at a bottom of the second inner lining; and
etching byproducts generated in the process area are discharged through the plurality of ventholes.

14. The plasma apparatus of claim 12, wherein:
a gap is formed between the first inner lining and the second inner lining;
a width of the gap ranges from 1 mm to 2 mm; and
a ratio of the predetermined length and the width of the gap is greater than 7:1.

15. The plasma apparatus of claim 10, wherein:
the lifting bellows is located outside the peripheral walls of the first inner lining and the second inner lining; and
a detachable rear cover is disposed at the sidewall of the chamber body in an area corresponding to the lifting bellows.

16. The plasma apparatus of claim 9, wherein:
a wafer transfer opening is disposed at a sidewall of the chamber body;
when feeding or reclaiming, the lifting drive device drives the second inner lining to ascend to a predetermined second position to move the second inner lining above the wafer transfer opening.

* * * * *